Figure 1:
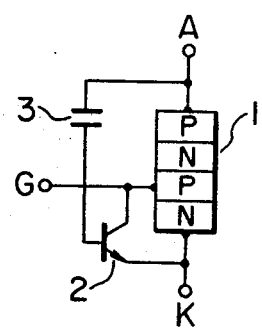

United States Patent [19]

Okuhara

[11] 4,365,170
[45] Dec. 21, 1982

[54] SEMICONDUCTOR SWITCH
[75] Inventor: Shinji Okuhara, Fujisawa, Japan
[73] Assignee: Hitachi, Ltd., Tokyo, Japan
[21] Appl. No.: 188,745
[22] Filed: Sep. 19, 1980
[30] Foreign Application Priority Data Sep. 21, 1979 [JP] Japan .............................. 54-120860
Sep. 21, 1979 [JP] Japan .............................. 54-120861

[51] Int. Cl.³ ........................................... H03K 17/72
[52] U.S. Cl. ............................ 307/252 A; 307/252 T; 357/38; 357/39
[58] Field of Search .......... 307/252 A, 252 D, 252 G, 307/252 J, 252 T, 252 B, 305; 357/38, 39

[56] References Cited
U.S. PATENT DOCUMENTS 4,039,863  8/1977  Ohhinata et al. ............... 307/252 A

FOREIGN PATENT DOCUMENTS 55-49034  4/1980  Japan .............................. 307/252 G Primary Examiner—John Zazworsky
Attorney, Agent, or Firm—Antonelli, Terry & Wands

[57] ABSTRACT

A semiconductor switch comprises a PNPN switch including a semiconductor PNPN structure having at least three PN junctions, a first and a second transistor and a discharging means. The emitter and collector terminals of the first transistor are connected to one main terminal and a region adjacent to the one main terminal, correspondingly and respectively, of the PNPN switch. The emitter and collector of the second transistor are connected to the other main terminal of the PNPN switch and a base of the first transistor, correspondingly and respectively, and the discharging means is connected between a base of the second transistor and a region of the PNPN switch which is adjacent to the other main terminal thereof to allow discharging of charges stored in the base of the second transistor, whereby the capability of protection against dv/dt effect of the PNPN switch may be improved, and the semiconductor switch may be readily implemented in an IC structure and may respond to a rapid voltage change.

2 Claims, 8 Drawing Figures

SEMICONDUCTOR SWITCH

The present invention relates to a semiconductor switch which includes a PNPN switch with improved capability of protection against dv/dt effect.

A PNPN switch including a semiconductor PNPN structure having at least three PN junctions (hereinafter) merely referred to as PNPN switch) is characterized by a high positive and a high negative blocking voltage and capability of controlling a large electric power with a small control power by its self-holding function and it is useful as a semiconductor switch. On the other hand, it has a disadvantage in that when a rapid forward voltage rise (noise voltage) is applied between an anode and a cathode of the PNPN switch, it is fired by a voltage change rate dv/dt (which is usually referred to as a rate effect). Accordingly, capability of protection against the dv/dt effect is to be improved and various considerations must be paid therefor.

Usually the gate-cathode path of the PNPN switch is shunted by a low-resistance resistor to enhance the capability of protection against the dv/dt effect but this approach deteriorates control sensitivity.

Figure 2:
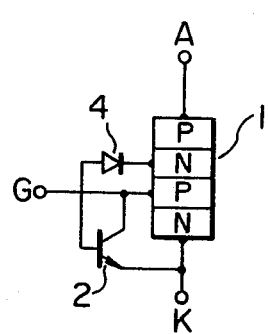
Figure 3:
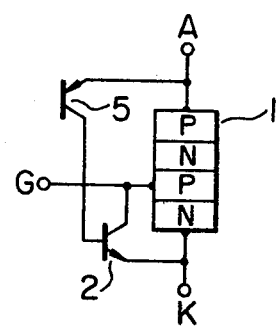

The inventor of the present invention has developed techniques shown in FIGS. 1 to 3 to overcome the above problem.

Objects, features and advantages of the present invention will become apparent from the following detailed description of prior art and preferred embodiments thereof taken in conjunction with the accompanying drawings, in which:

FIGS. 1, 2, and 3 show circuit configurations of prior art semiconductor switches; and FIGS. 4, 5, 6, 7, and 8 show circuit configurations of a first, a second, a third, a fourth, and a fifth embodiment, correspondingly and respectively, of a semiconductor switch in accordance with the present invention.

The technique shown in FIG. 1 is disclosed in the U.S. Pat. No. 3,609,413 in which a collector and an emitter of a transistor 2 are connected across a gate G and a cathode K of a PNPN switch 1 while a base of the transistor 2 is connected to an anode A of the PNPN switch through a capacitor 3. When a dv/dt change is applied, the transistor 2 is operated transiently by a charging current of the capacitor 3 to short-circuit the gate G-cathode K path. Since the transistor 2 is normally not operated, control sensitivity at the gate G is not deteriorated. Accordingly, the technique shown in FIG. 1 is advantageous with respect to the compatibility of the capability of protection against the dv/dt effect and the control sensitivity. However, this technique includes the capacitor as one of components. The capacitor requires a large space in a semiconductor IC and hence this circuit is not applicable to the IC implementation.

As an approach adaptable for the IC implementation, the inventor has proposed the technique shown in FIG. 2 in which a diode 4 is connected between the base of the transistor 2 and a layer (anode gate) of the PNPN switch 1 which is adjacent to the anode A and a charging current of a junction capacitance of the diode 4 is used to transiently operate the transistor 2 to short-circuit the gate G-cathode K path of the PNPN switch like in the case of FIG. 1. In this technique, however, a differentiation current flows from the N-conductivity region (anode gate) adjacent to the anode A toward the diode 4. This is equivalent to the application of the anode gate drive and hence the capability of protection against the dv/dt effect is more or less deteriorated with respect to the technique shown in FIG. 1.

An approach for implementing the IC structure of FIG. 1 while eliminating the anode gate drive is shown in FIG. 3, in which a second transistor 5 is connected between the anode A and the base of the transistor 2 with a base thereof floating. This technique also has a disadvantage that the capability of protection against the dv/dt effect is more or less deteriorated because the base of the second transistor 5 floats and hence when dv/dt pulses are repetitively applied to the anode A-cathode K circuit at a high repetition rate, charges remain at the base, which causes to decrease the differentiation current resulting in the unlikelihood of substantial improvement of the capability of protection against the dv/dt effect.

It is an object of the present invention to provide a semiconductor switch which is adapted for the IC implementation, has an improved capability of protection against the dv/dt effect and may respond to a voltage change at a high repetition rate.

According to the present invention, a semiconductor switch is provided, which comprises a PNPN switch including a semiconductor PNPN structure having at least three PN junctions, a first and a second transistor and a discharging means, with an emitter and a collector of the first transistor being connected to one main terminal of the PNPN switch and a region adjacent to the region connected to said one main terminal, correspondingly and respectively, an emitter of the second transistor being directly or indirectly connected to the other main terminal of the PNPN switch, a collector of the second transistor being connected to a base of the first transistor, and the discharging means being connected between a base of the second transistor and a region of the PNPN switch which is adjacent to a region connected to said other main terminal so that charges stored in the base of the second transistor is discharged.

Figure 4:
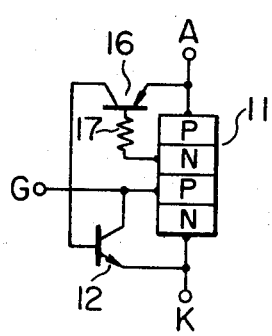

FIG. 4 shows a circuit diagram of the first embodiment of the present invention, in which a collector and an emitter of a first (NPN) transistor 12 are connected across a gate G and a cathode K of a PNPN switch 11 having an anode A, the cathode K, and the gate G. A base of the first transistor 12 is connected to a collector of a second (PNP) transistor 16 having an emitter thereof connected to the anode A of the PNPN switch 11. A base of the second transistor 16 is connected to an N-conductivity region (anode gate) of the PNPN switch 11 which is adjacent to the anode A through a resistor 17 which functions to discharge charges stored in the base of the second transistor 16 so that a potential of the base of the second transistor may be kept to be the same potential as that of the anode gate of the PNPN switch 11, as will be explained later. It is usual that the resistor is made in the form of a resistor for the exclusive use, but in a high breakdown voltage IC it may be an equivalent resistance of both a base internal resistance (which is liable to become relatively high resistance) of the transistor 16 and an anode gate internal resistance of the PNPN switch 11. In certain cases, it may be an AC resistance such as a coil.

In this arrangement, when a forward voltage rise is applied across the anode A and the cathode K of the PNPN switch 11, a charging current for a junction capacitance which exists in the base-collector junction of the second transistor 16 is amplified with Miller effect and the amplified current flows into the base of the first transistor 12, which is then activated to short-circuit the gate G-cathode K path to prevent the rate effect due to the charging current for the center PN junction of the PNPN switch 11. A potential difference across the resistor 17 is almost zero because the both terminals of the resistor 17 each have a potential which is different by one-PN-junction voltage from the anode A potential and hence they are at the same potential accordingly, no current flows therebetween, or even if there should be a small potential difference the current is limited by the resistor and the problem encountered in FIG. 2 (that is, the differentiation current flows from the N-conductivity region adjacent to the anode A toward the diode 4 so that the anode gate drive is carried out and therefore the capability of protection against the dv/dt effect is more or less deteriorated) is avoided. On the other hand, when a current is caused to flow through the gate G thereby to fire the PNPN switch 11 while a DC voltage is applied across the anode A and the cathode K of the PNPN switch 11, the potential difference between A and K decreases (by about one volt), but if the resistor 17 is not inserted, the charges stored between the base and the collector of the transistor 16 (with the base being positive and the collector being negative) before the PNPN switch 11 is fired are not fully discharged because the base-emitter circuit of the transistor 16 is biased in a blocking polarity. As a result, the problem discussed above in connection with FIG. 3 (that is, when the dv/dt pulses are repetitively applied at a high repetition rate between the anode A and the cathode K, the charges stored in the base of the second transistor 5 remain non-discharged and the differentiation current decreases resulting in the unlikelihood of the substantial improvement of the capability of protection against the dv/dt effect) may be encountered. In the present embodiment shown in FIG. 4, because of the provision of the resistor 17, the base potential of the transistor 16 rapidly approaches the anode gate potential of the PNPN switch in accordance with a time constant determined by the resistance of the resistor 17 and the junction capacitance. As a result, a sufficient protection function against the dv/dt effect is attained to the forward voltage rise to be applied at next time.

Figure 5:
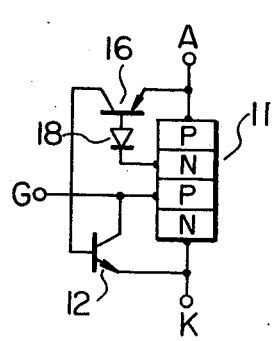

FIG. 5 shows a circuit diagram of the second embodiment of the present invention, in which a collector and an emitter of a first (NPN) transistor 12 are connected between a gate G and a cathode K of a PNPN switch 11 having an anode A, the cathode K and the gate G. A base of the first transistor 12 is connected to a collector of a second (PNP) transistor 16 having an emitter thereof connected to the anode A of the PNPN switch 11. A base of the second transistor 16 is connected to an anode of a diode 18, a cathode of which is connected to an N-conductivity region (anode gate) of the PNPN switch 11 which is adjacent to the anode A. The diode 18 functions to discharge the charges stored in the base of the second transistor 16 to prevent the base potential from rising above the anode gate potential of the PNPN switch 11, as will be explained later. With this construction, when a forward voltage rise is applied across the anode A and the cathode K of the PNPN switch 11, a charging current for a junction capacitance which exists in the base-collector junction of the second transistor 16 is amplified with Miller effect and the amplified current flows into the base of the first transistor 12 to activate the first transistor 12 which in turn short-circuits the gate G-cathode K path of the PNPN switch 11 to prevent the rate effect due to the charging current for the center PN junction of the PNPN switch 11. A voltage-drop across the diode 18 is almost zero (because the both terminals of the diode 18 each have a potential which is different by one-PN-junction voltage from the anode A potential and hence they are at the same potential), and even if a small potential difference exists therebetween the problem discussed in conjunction with FIG. 2 does not occur because the diode 18 is polarized such that it blocks a current from flowing out of the anode gate. On the other hand, when a current is caused to flow through the gate G of the PNPN switch 11 to fire it while a D.C. voltage is applied across the anode A and the cathode K of the PNPN switch 11, a potential difference between A and K decreases (by about one volt) but if the diode 18 is not inserted as shown in FIG. 3, the charges stored in the base-collector region of the transistor 5 (with the base being positive and the collector being negative) before the PNPN switch 11 is fired are not discharged because the base and the emitter are biased in a blocking polarity and the problem discussed in conjunction with FIG. 3 occurs. In the embodiment of the present invention shown in FIG. 5, because of the provision of the diode 18, the charges stored in the base of the diode 16 discharge toward the anode gate (N-conductivity region) of the PNPN switch 11 and the base potential rapidly approaches the anode gate potential. As a result, a sufficient protection function against the dv/dt effect is attained to the forward voltage rise to be applied at next time.

Figure 6:
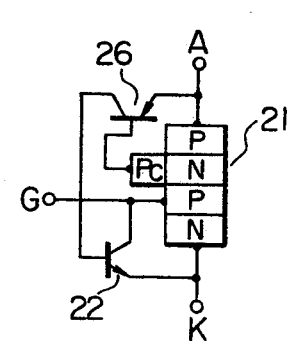

FIG. 6 shows a circuit diagram of the third embodiment of the present invention, in which in place of the diode 18 shown in FIG. 5 another P-conductivity region Pc is added to an anode gate (N-conductivity region) of a PNPN switch 21 which is adjacent to an anode A, and a base of a second transistor 26 is connected to the region Pc. The provision of the additional region Pc to the PNPN switch 21 can be readily implemented in the art of semiconductor. In this construction, the base of the second transistor 26 is equivalently connected to the anode gate of the PNPN switch through one PN junction and hence the same effect as that of the embodiment of FIG. 5 is attained. Since an independent diode is not needed the present structure is advantageous for the IC implementation.

Figure 7:
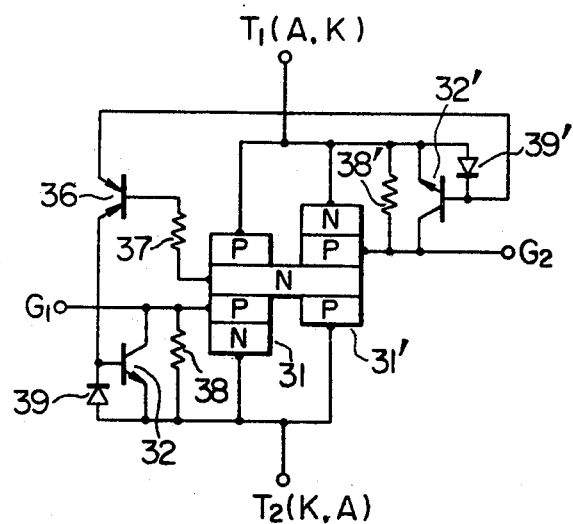

FIG. 7 shows a circuit diagram of the fourth embodiment of the present invention, in which collectors and emitters of first transistors 32 and 32' and resistors 38 and 38' are connected between a gate $G_1$ and a cathode $T_2$ and between a gate $G_2$ and a cathode $T_1$, correspondingly and respectively, of a pair of anti-parallel PNPN switches 31 and 31' having a common anode gate region (N-conductivity region). Diodes 39 and 39' are connected between bases and emitters of the first transistors 32 and 32', correspondingly and respectively, with the bases being connected to a second transistor 36 as shown in FIG. 7. A base of the second transistor 36 is connected to the anode gate (common N-conductivity region) of the PNPN switch 31 through a resistor 37. While the second transistor 36 is shown as having two emitters and no collector, one of the two emitters functions as an intrinsic emitter while the other functions as an intrinsic collector or vice versa depending on a polarity of an applied voltage. This structure can be readily attained in an IC by a lateral transistor structure and backward breakdown voltages between the emitters and the base are high. The resistors 38 and 38' serve to impart the stability of the PNPN switches 31 and 31' for high temperature leakage currents, and they may be of relatively high resistance. The diodes 39 and 39' allow a potential difference between the main terminals $T_1$ and $T_2$ of the PNPN switch to be indirectly applied, through those diodes, to the emitters of the second transistor 36 connected between the bases of the transistors 32 and 32'.

With this construction, when the potential of the main terminal $T_1$ rises forwardly with respect to the main terminal $T_2$, the potential of the main terminal $T_1$ is applied to the upper emitter (as viewed in the drawing) of the transistor 36 through the diode 39' so that the transistor 32 is activated as is the case of FIG. 4 to prevent the fire of the PNPN switch 31. (The PNPN switch 31' is in reverse blocking condition at this time). When the PNPN switch 31 is compelled to fire, the resistor 37 functions to discharge the charges in the transistor 36 as is the previous case. When the polarities of the voltages are reversed, the diode 39 and the transistors 36 and 32' prevent the rate effect for the PNPN switch 31'. While the PNPN switch 31 is shown as an anti-parallel switch having the common anode gate (N-conductivity region), a similar effect may be attained when two conventional PNPN switches are connected in anti-parallel with the anode gates (N-conductivity regions) of the respective PNPN switches being connected through a resistor.

Figure 8:
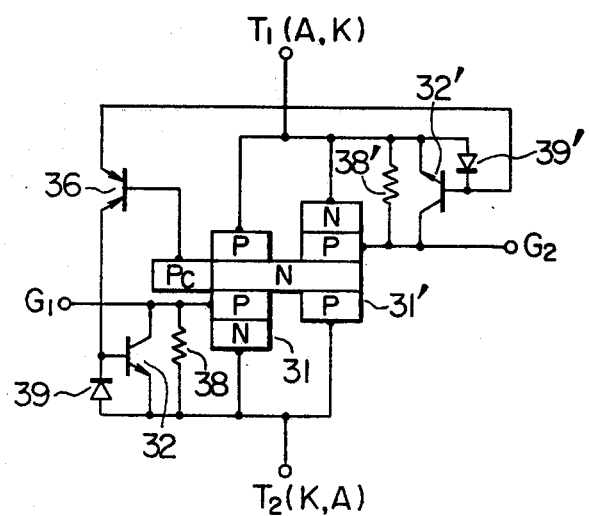

FIG. 8 shows a circuit diagram of the fifth embodiment of the present invention, in which collectors and emitters of first transistors 32 and 32' and resistors 38 and 38' are connected between gate $G_1$ and cathode $T_2$ and between gate $G_2$ and cathode $T_1$, respectively, of a pair of anti-parallel PNPN swtiches 31 and 31' having a common anode gate (N-conductivity region) and an additional region Pc like in the case of FIG. 6. Diodes 39 and 39' are connected between bases and emitters of the first transistors 32 and 32' like in the case of FIG. 7 with bases thereof being connected to a second transistor 36 as shown. A base of the second transistor 36 is connected to the additional region Pc of the PNPN switches 31 and 31'. Since the operation of the circuit shown in FIG. 8 can be readily understood from the circuit shown in FIG. 7, the explanation thereof is omitted.

In the explanation described above, it is implied that the second transistor 16 or 36 is of PNP type which has a high breakdown voltage for a bilateral voltage when it is integrated with the PNPN switch, it should be understood that a complementary circuit with the P and N conductivity regions being reversed to each other may be provided.

As described hereinabove, according to the present invention, a technology useful to a semiconductor switch which may improve the capability of protection against the dv/dt effect, may be readily implemented in IC structure and may respond to a voltage change of high repetition rate is provided.

What is claimed is:

1. A semiconductor switch comprising: a pair of anti-parallel PNPN switches each including a semiconductor PNPN structure having a common N-conductivity base region and at least three PN junctions; a first and a second transitor; a third transistor having two emitters and a base; and a resistor, an emitter and a collector of said first transistor being connected to a cathode and a P-conductivity region, correspondingly and respectively, of one of said PNPN switch pair, an emitter and a collector of said second transistor being connected to a cathode and a P-conductivity base region, correspondingly and respectively, of the other PNPN switch, said two emitters of said third transistor being connected to bases of said first and second transistors, respectively, a base of said third transistor being connected to said common N-conductivity base region of said pair of anti-parallel PNPN switches through said resistor.

2. A semiconductor switch comprising: a pair of anti-parallel PNPN switches each including a semiconductor PNPN structure having a common N-conductivity base region and at least three PN junctions; a P-conductivity additional region disposed adjacent to said common N-conductivity base region; a first and a second transistor; and a third transistor having two emitters and a base, an emitter and a collector of said first transistor being connected to a cathode and a P-conductivity base region, correspondingly and respectively, of one of said PNPN switch pair, an emitter and a collector of said second transistor being connected to a cathode and a P-conductivity base region of the other PNPN switch correspondingly and respectively, said two emitters of said third transistor being connected to bases of said first and second transistors, respectively, a base of said third transistor being connected to said P-conductivity additional region.

* * * * *